United States Patent
Knirck et al.

(10) Patent No.: US 6,885,116 B2
(45) Date of Patent: Apr. 26, 2005

(54) MOVING COIL LINEAR MOTOR POSITIONING STAGE WITH A CONCENTRIC APERTURE

(76) Inventors: Jeffrey G. Knirck, 868 Jasmine Dr., Sunnyvale, CA (US) 94086; Paul A. Swanson, 19890 Pear Tree La., Cupertino, CA (US) 94086

( * ) Notice: Subject to any disclaimer, the term of this patent is extended or adjusted under 35 U.S.C. 154(b) by 0 days.

(21) Appl. No.: 10/138,816

(22) Filed: May 6, 2002

(65) Prior Publication Data

US 2004/0174076 A1 Sep. 9, 2004

(51) Int. Cl.[7] .......................... H02K 41/00; G11B 7/00
(52) U.S. Cl. .......................... 310/12; 355/72; 378/34; 378/35; 359/260; 369/147; 369/115
(58) Field of Search .......................... 310/12; 355/72, 355/75; 359/620; 378/34, 35

(56) References Cited

U.S. PATENT DOCUMENTS

| | | | |
|---|---|---|---|
| 4,318,038 A | * | 3/1982 | Munehiro .................... 318/135 |
| 4,461,984 A | | 7/1984 | Whitaker et al. ............ 318/687 |
| 4,538,964 A | | 9/1985 | Brown ........................ 417/267 |
| 4,671,638 A | | 6/1987 | Capobianco et al. ..... 354/234.1 |
| 4,704,712 A | | 11/1987 | Siryj .......................... 369/249 |
| 5,040,372 A | | 8/1991 | Higham ............................ 62/6 |
| 5,130,583 A | * | 7/1992 | Andoh ......................... 310/12 |
| 5,438,451 A | | 8/1995 | Schweizer ................... 359/393 |
| 5,492,313 A | | 2/1996 | Pan et al. .................... 267/161 |
| 5,779,455 A | | 7/1998 | Steiger ........................ 417/418 |
| 5,980,211 A | | 11/1999 | Tojo et al. ..................... 62/228 |
| 6,055,116 A | | 4/2000 | Nomura et al. ............. 359/822 |
| 6,129,527 A | | 10/2000 | Donahoe et al. ............ 417/416 |
| 6,141,300 A | * | 10/2000 | Getreuer et al. ......... 369/44.14 |
| 6,144,118 A | * | 11/2000 | Cahill et al. .................. 310/12 |
| 6,160,768 A | * | 12/2000 | Yanagawa ................ 369/13.32 |
| 6,163,091 A | * | 12/2000 | Wasson et al. ................ 310/12 |
| 6,211,514 B1 | * | 4/2001 | Schultz et al. ........... 250/222.1 |
| 6,211,946 B1 | * | 4/2001 | Ohtomo et al. ............... 355/53 |
| 6,603,531 B1 | * | 8/2003 | Binnard ........................ 355/75 |
| 6,741,332 B1 | * | 5/2004 | Nishi ........................... 355/72 |

* cited by examiner

Primary Examiner—Darren Schuberg
Assistant Examiner—J. Aguirrechea
(74) Attorney, Agent, or Firm—Fountainhead Law Group; Chad R Walsh

(57) ABSTRACT

A moving coil linear motor positioning stage with a concentric aperture is disclosed. The present invention relates to positioning an element or device such as an optic or lens. The apparatus is ideal for moving an optic coaxial with a light beam. The present invention uses a voice coil motor with a cylindrical moving coil and a cylindrical permanent magnet assembly with a radial gap. The moving coil and magnet assemblies have clear apertures concentric with the apparatus and the axis of motion. A pair of planar flexures guides the moving coil. A position-sensing device is used to sense the position of the moving coil to enable fine position control.

4 Claims, 1 Drawing Sheet

MOVING COIL LINEAR MOTOR POSITIONING STAGE WITH A CONCENTRIC APERTURE

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates to moving or positioning an element or device such as an optic or lens.

Stages for positioning optics are common, including stages that move an optic along the optical axis. They are frequently used to move an optical element to affect the focus or collimation of an optical beam in an optical system. Such systems are used for applications ranging from microscopes to systems requiring a focused laser beam for drilling. As the precision, accuracy and speed requirements of such systems increases, the old stage designs become inadequate.

The typical optic positioning stage uses one or more linear bearings mounted parallel to but offset from the optical axis. The optic is driven using a screw, which is also mounted, parallel to but offset from the optical axis. This arrangement produces torques about the optical axis resulting in both lateral and angular perturbations to the optical element resulting in translation and or distortion of the optical beam. Screw based stages are also not particularly fast. Bearing stages in general contain stiction and friction that can cause degradation of overall servo performance.

Alternatives to slow screw drives are available. One such alternative is a linear motor. They can be commutated multiple pole motors or single phase voice coils. The magnet can move or the coil can move. Linear motors have been used to move optics but they are still mounted off axis, which causes torques. Flexures are a good way to guide a linear motor over a short stroke. Flexures can be arranged to guide the linear motor symmetrically about the force axis. This arrangement is common with reciprocating compressors and pumps.

The ideal arrangement would use a voice coil motor to produce quick motion. The coil would be guided symmetrically about the force axis using flexures. To make the stage useful for optical systems and not produce torques the optical beam must be allowed to pass through the center of the motor, which is along the force and constraint axis. There must be a clear aperture through the center of the stage.

Capobianco et al 4,671,638 (June 1987) teaches about a "moving coil electromagnetic actuator and shutter employing same". Capobianco is differentiated from the present invention by both purpose and means. Capobianco uses a moving coil motor and planar flexures to affect an optical beam. However, the flexures are used for rotational rather than translation motion. The optical axis, the flexure axis and the coil axis are parallel and offset from each other. It is actually a planar device to create rotation of a pair of blades to create an optical shutter. The present invention moves an optical element along the optical axis, which is coaxial with the stage force vector and the center of mass. The present invention is cylindrically symmetric.

Steiger 5,779,455 (July 1998) teaches about a "device for guiding and centering a machine component". Steiger is differentiated from the present invention by both purpose and means. Steiger describes using a double set of planar flexures to guide a piston. An alternating current linear motor is used to turn the device into a reciprocating pump. Steiger does not use a position feedback element to allow for position control. Steiger does not use a moving coil motor to maximize performance. Most importantly, Steiger doesn't provide a centrally located clear aperture that would make it useful for mounting an optical element.

Donahoe et al 6,129,527 (October 2000) discloses an "electrically operated linear motor with integrated flexure spring and circuit for use in reciprocating compressor". Donahoe is differentiated from the present invention by both purpose and means. Donahoe is also describing a reciprocating compressor. It does have a moving coil motor and planar flexures, but, the flexures are used as springs and there is no means to precisely control position. The device also doesn't have a central clear aperture or a means to control the position of the moving coil.

Schweizer 5,438,451 (August 1995) teaches about a "linearly fine-adjustment stage". Schweizer is differentiated from the present invention by both purpose and means. Schweizer describes using a piezoelectric translator and elastic elements to guide the stage plate all through a central axis. Schweizer does not have a clear aperture on the axis, and flexures are not used to guide a voice coil with a position sensor.

Bohdan 4,704,712 (November 1987) teaches about a "low-friction slide apparatus for optical disc translation stage". Bohdan is differentiated from the present invention by both purpose and means. Bohdan describes using a linear motor and a linear bearing but they are also off-axis from where an optic could be mounted.

Kaisha 6,055,116 (May 2000) teaches about a "multistage extension type zoom lens barrel". The goal of Kaisha is to move an optical element linearly along the optical axis. The device does have a clear aperture on the axis. The device is guided concentrically about the optical axis. However, the constraint means is a large diameter screw thread. The drive means is an external rotary electric that drives a screw to create linear motion. The present invention used a position controlled voice coil motor guided by planar flexures.

| Other References Cited | | |
|---|---|---|
| 4,461,984 | July 1984 | Whitaker |
| 5,040,372 | August 1991 | Higham |
| 5,980,211 | November 1999 | Tojo |
| 4,538,964 | September 1985 | Brown |
| 5,492,313 | February 1996 | Pan |

BRIEF SUMMARY OF THE INVENTION

The principal object of the present invention is to provide a means to position an optical element along an optical axis precisely and quickly without lateral or angular perturbations.

The present invention accomplishes its objective by using a moving coil permanent magnet motor with a position feedback element to maximize speed and precision of motion. The moving coil and a pair of planar flexures produces a force vector through the optical axis and the center of mass of the moving mass.

The present invention would be ideal for use in an optical system to adjust the focus, collimation or other optical feature accomplished by moving a lens along the optical axis. Other uses, objects, features and advantages of the present invention will become apparent from the following detailed description when taken in conjunction with the accompanying drawings.

DETAILED DESCRIPTION OF THE INVENTION

Figure 1:
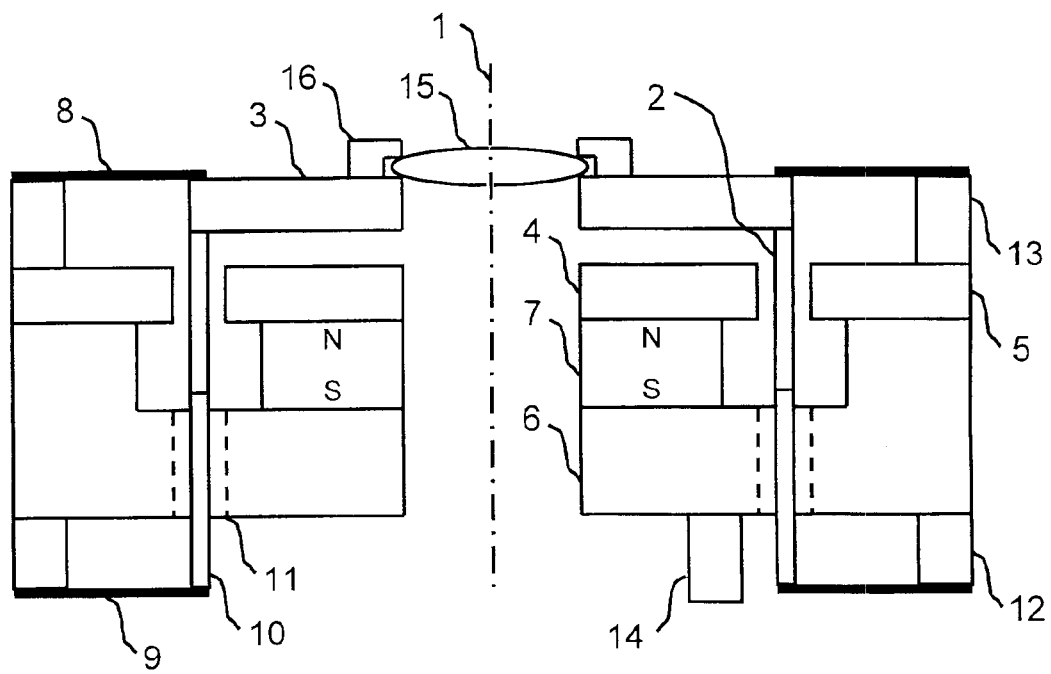
FIG. 1 is a cross-sectional diagram of the cylindrically symmetric present invention.

The present invention provides a means to position an optical element along an optical axis precisely and quickly without lateral or angular perturbations. The present invention is a moving coil linear motor positioning stage with a concentric aperture. The advantages of the present invention are its speed and precision, and the positioning motion has no lateral or angular components.

The details of the present invention can be implemented in numerous variations of configuration and components. In any case the basic concept is the same. Various types or configurations of flexures or other linear bearings could be used to guide the moving assembly. Various types or configurations of position sensing devices could be used.

FIG. 1 shows a cross-sectional diagram of the present invention on which and Optical Element 15 is mounted. The present invention is cylindrically symmetric about a Central Axis 1, particularly the moving mass. A useful clear aperture is formed by a hollow center to the device. The primary moving element is a Voice Coil Ring 3 on which an electrical Coil 2 is wound circumferentially about the Central Axis 1. The Voice Coil Ring 3 has a central opening through which light can pass. An Optical Element 15 or other element to be move can be mounted to the Voice Coil Ring 3 with its center of mass in the Central Axis. An Element Mount 16 is provided to secure an Optical Element 15 to the Voice Coil Ring 3.

The Voice Coil Ring is suspended in an annular magnetic gap formed by annular iron poles pieces, Inner Pole 4 and Outer Pole 5. An annular Permanent Magnet 7 produces the magnetic flux. Annular Back Iron 6 completes the magnetic flux path. The Voice Coil Ring is suspended along its outer perimeter using a pair of planar flexures, Upper Flexure 8 and Lower Flexure 9. Each flexure is arranged to guide motion along the Central Axis while being radially stiff. The pair of planar flexures stiffens the assembly against tilting of the major axis of the moving mass with respect to the central axis. The magnetic circuit elements and flexures also have similar central openings through which light can pass. The Upper Flexure 8 supports the upper part of the Voice Coil Ring. The Upper Flexure 8 is mounted by its outer perimeter to an Upper Flexure Ring 13 that is in turn mounted to the Back Iron 6. The Lower Flexure 9 is also mounted to the Back Iron 6 by its outer perimeter to a Lower Flexure Ring 12 that is in turn mounted. The lower part of the Voice Coil Ring is suspended by the inner perimeter of the Lower Flexure 9 via at least three Standoffs 10. The Standoffs 10 pass through Standoff Holes 11 in the Back Iron 6.

Position Sensor 14 is used to precisely sense the position of the moving Voice Coil Ring 3 assembly with respect to the typically immobile Back Iron 6 and everything attached to it. Various types of sensors would be appropriate for this application. A non-contact optical or magnetic sensor would be best.

Mounting holes are provided in the Back Iron 6 to allow mounting the device in a system. An optical element can be mounted to the Voice Coil Ring with its optical axis on the Central Axis. Controlling the position of the Voice Coil Ring by appropriate electrical control would control the position of the mounted optical element along the optical axis. Appropriate control electronics must be used to control electrical current through the Coil 2 as needed according to the signal returned by the Position Sensor 14. A good choice would be a classical Proportional-Integral-Derivative control law that combines a commanded position signal with the feedback signal from the Position Sensor to generate a drive current for the Coil.

The above descriptions are illustrative and not restrictive. Many variations of the invention will become apparent to those skilled in the art upon review of this disclosure. Merely by way of example, various configurations of flexures could be used or the flexures could be replaced by other linear bearings. Bushing type bearing like a plastic bushing, a ball bushing, or an air bearing would work as appropriate. The magnet could be polarized either axially or radially. The present invention could be used in a system to move an optic as primarily described herein, or it could be used to move any device or element that would benefit from the axial motion features of the present invention.

The scope of the invention should therefore be determined not just with reference to the above description, but instead should be determined with reference to the appended claims along with their full scope of equivalents.

We claim:

1. A linear motion stage apparatus, for use in an optical system, comprising:

a moving coil linear motor with an opening centered on an optical axis;

a means to mount an optical element on the moving coil coaxial with the optical axis;

a magnet for producing a magnetic flux;

an inner pole with an opening centered on an optical axis;

an outer pole with an opening centered on an optical axis, wherein the moving coil is suspended in an annular gap formed by the inner and outer annular poles;

a backiron with an opening centered on an optical axis. wherein the backiron completes a magnetic flux path;

a flexure arrangement with a central opening centered on an optical axis to guide the moving coil along the optical axis; and a position sensor to facilitate position control of the moving coil.

2. A linear motion stage apparatus of claim 1 where:

the opening in the moving coil linear motor is concentric with the axis of the moving coil.

3. A linear motion stage apparatus of claim 1 where:

the flexure arrangement comprises first and second flexure elements to guide the motion of the moving coil along the optical axis.

4. A linear motion stage apparatus of claim 1 where:

the flexure arrangement is replaced by a bushing bearing.

* * * * *